US007965148B2

(12) United States Patent
Larsen

(10) Patent No.: US 7,965,148 B2
(45) Date of Patent: Jun. 21, 2011

(54) ATOMIC FREQUENCY CLOCK SYSTEMS AND METHODS

(75) Inventor: Michael S. Larsen, Woodland Hills, CA (US)

(73) Assignee: Northrop Grumman Guidance and Electronics Company, Inc., Los Angeles, CA (US)

( * ) Notice: Subject to any disclaimer, the term of this patent is extended or adjusted under 35 U.S.C. 154(b) by 136 days.

(21) Appl. No.: 12/534,615

(22) Filed: Aug. 3, 2009

(65) Prior Publication Data

US 2011/0025425 A1 Feb. 3, 2011

(51) Int. Cl.
*H01S 1/06* (2006.01)
*H03B 17/00* (2006.01)

(52) U.S. Cl. .......................................... 331/94.1; 331/3

(58) Field of Classification Search .................. 331/94.1
See application file for complete search history.

(56) References Cited

U.S. PATENT DOCUMENTS 5,148,437 A * 9/1992 Ohtsu ............................ 372/32
5,657,340 A * 8/1997 Camparo et al. ................ 372/69
6,320,472 B1 * 11/2001 Vanier .......................... 331/94.1
2009/0309668 A1 * 12/2009 Bulatowicz et al. ......... 331/94.1

* cited by examiner

*Primary Examiner* — Joseph Chang
(74) *Attorney, Agent, or Firm* — Tarolli, Sundheim, Covell & Tummino LLP

(57) ABSTRACT

One embodiment of the invention includes an atomic clock system including an alkali beam cell and an interrogation system configured to generate an optical pump beam and at least one optical probe beam that illuminate a detection chamber of the beam cell to pump evaporated alkali metal atoms. An optical detection system can provide a microwave signal to the detection chamber and can measure an intensity of the optical pump beam to determine a transition frequency corresponding to optimum photon absorption of the evaporated alkali metal atoms. A photodetection system can measure an intensity of the at least one optical probe beam and to generate an intensity signal that is provided to the optical detection system to substantially cancel Doppler broadening of the transition frequency resulting from non-orthogonal planar movement of the evaporated alkali metal atoms relative to the optical pump beam and the at least one optical probe beam.

20 Claims, 3 Drawing Sheets

ATOMIC FREQUENCY CLOCK SYSTEMS AND METHODS

TECHNICAL FIELD

The present invention relates generally to beam cell systems, and specifically to atomic clock systems and methods.

BACKGROUND

Alkali beam cells can be utilized in various systems which require extremely accurate and stable frequencies, such as alkali beam atomic clocks. As an example, alkali beam atomic clocks can be used in bistatic radar systems, global positioning systems (GPS), and other navigation and positioning systems, such as satellite systems. Atomic clocks are also used in communications systems, such as cellular phone systems.

An alkali beam cell typically contains an alkali metal. For example, the metal can be Cesium (Cs). Light from an optical source can pump the atoms of an evaporated alkali metal from a ground state to a higher state, from which they can fall to a different hyperfine state. An interrogation signal, such as a microwave signal or intensity modulated light beam, can then be applied to the alkali beam cell and an oscillator controlling the interrogation signal can be tuned to a particular frequency so as to maximize the repopulation rate of the initial ground state. A controlled amount of the light can be propagated through the alkali beam cell and can be detected, such as by a photodetector, to form a state detection device.

By examining the output of the detection device, a control system can provide various control signals to the oscillator and light source to ensure that the wavelength of the propagated light and microwave frequency are precisely controlled, such that the microwave input frequency and hyperfine transition frequency are substantially the same. The oscillator thereafter can provide a highly accurate and stable frequency output signal for use as a frequency standard or atomic clock. However, Doppler broadening of the measured hyperfine transition frequency can occur as a result of non-orthogonal planar movement of the evaporated alkali metal atoms relative to the optical source, such as resulting from the random thermal motion of the alkali metal.

SUMMARY

One embodiment of the invention includes an atomic clock system including an alkali beam cell and an interrogation system configured to generate an optical pump beam and at least one optical probe beam that illuminate a detection chamber of the beam cell to pump evaporated alkali metal atoms. An optical detection system can provide a microwave signal to the detection chamber and can measure an intensity of the optical pump beam to determine a transition frequency corresponding to optimum photon absorption of the evaporated alkali metal atoms. A photodetection system can measure an intensity of the at least one optical probe beam and to generate an intensity signal that is provided to the optical detection system to substantially cancel Doppler broadening of the transition frequency resulting from non-orthogonal planar movement of the evaporated alkali metal atoms relative to the optical pump beam and the at least one optical probe beam.

Another embodiment of the invention includes a method for tuning a frequency reference of an atomic clock. The method comprises generating an optical pump beam and at least one optical probe beam that are configured to illuminate the detection chamber to pump evaporated alkali metal atoms into a hyperfine state as they are collected in a detection chamber of an alkali beam cell and providing a microwave signal having a controlled frequency to the detection chamber. The method also includes measuring an intensity of the optical pump beam exiting the detection chamber across a frequency spectrum of the microwave signal to generate an absorption spectrum indicative of a transition frequency of the microwave signal corresponding to optimum photon absorption of the evaporated alkali metal atoms. The method also includes measuring an intensity of the at least one optical probe beam exiting the detection chamber across the frequency spectrum of the microwave signal and generating an intensity signal corresponding to the intensity of the at least one optical probe beam. The method also includes combining the intensity signal with the absorption spectrum to substantially cancel Doppler broadening of the transition frequency resulting from non-orthogonal planar movement of the evaporated alkali metal atoms relative to the optical pump beam and the at least one optical probe beam. The method further includes locking the controlled frequency of the microwave signal to the transition frequency to provide a substantially accurate frequency reference of the atomic clock.

Another embodiment of the invention includes an atomic clock system. The system comprises means for generating an optical pump beam that illuminates a detection chamber to pump evaporated alkali metal atoms into a hyperfine state as they are collected in a detection chamber of an alkali beam cell and means for generating an optical probe beam that is substantially co-linear with and in an opposite direction of the optical pump beam. The system also includes means for providing a microwave signal having a controlled frequency to the detection chamber and means for measuring an intensity of the optical pump beam exiting the detection chamber across a frequency spectrum of the microwave signal to generate an absorption spectrum indicative of a transition frequency of the microwave signal corresponding to optimum photon absorption of the evaporated alkali metal atoms. The system further includes means for measuring an intensity of the optical probe beam exiting the detection chamber across the frequency spectrum of the microwave signal and for generating an intensity signal corresponding to the intensity of the at least one optical probe beam. The intensity signal can be provided to the means for measuring the intensity of the optical pump beam to substantially cancel Doppler broadening of the transition frequency resulting from non-orthogonal planar movement of the evaporated alkali metal atoms relative to the optical pump beam and the optical probe beam.

DETAILED DESCRIPTION

Figure 1:
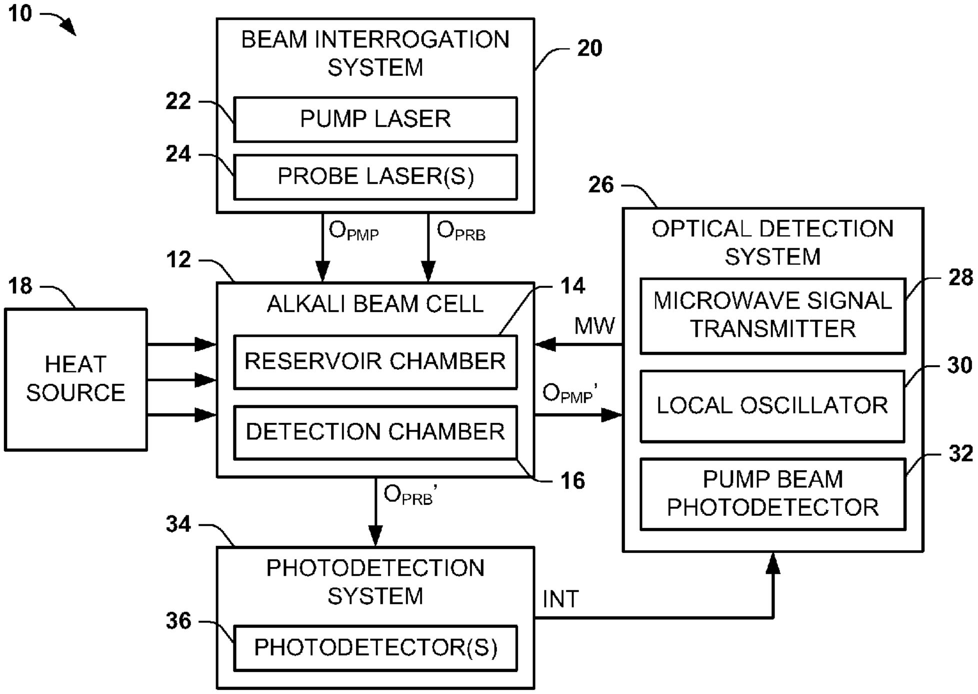
FIG. 1 illustrates an example of a diagram of an atomic clock system in accordance with an aspect of the invention.

The present invention relates generally to beam cell systems, and specifically to a Doppler-free atomic frequency standard. An alkali beam cell, such as can be implemented in an atomic clock, includes a reservoir chamber and a detection chamber. During operation of the alkali beam cell, the reservoir chamber can hold an alkali metal, such as Cesium (Cs), that evaporates in response to heat. The detection chamber can collect the evaporated alkali metal. A beam interrogation system can include a pump laser configured to generate an optical pump beam to illuminate the detection chamber. Evaporated alkali metal atoms that move through the detection chamber can thus be pumped to a specific hyperfine ground state by absorbing photons from the optical pump beam, and can be pumped back to the initial hyperfine ground state by emitting or absorbing photons in response to a microwave signal having a controlled frequency that corresponds to the hyperfine transition. The controlled frequency can be swept across a broad frequency range, such that an absorption spectrum can be obtained to ascertain a transition frequency of the evaporated alkali metal atoms that corresponds to an optimum absorption frequency having a very narrow linewidth. A local oscillator, such as able to control the frequency of the microwave signal, can thus be locked to the transition frequency to obtain a frequency reference for the atomic clock.

Because the alkali metal must be heated to a sufficiently high temperature (e.g., greater than or equal to approximately 80 degrees Celsius) to generate a sufficient vapor density, the evaporated alkali metal atoms can have a very random direction of motion through the detection chamber. As a result, absorption and emission of photons from evaporated alkali metal atoms that move in a non-orthogonal plane relative to the optical pump beam can result in a Doppler broadening of the optimum absorption frequency linewidth. As described herein, the evaporated alkali metal atoms that move in the substantially orthogonal plane relative to the optical pump beam are "stationary" atoms and the evaporated alkali metal atoms that move in the non-orthogonal plane relative to the optical pump beam are "non-stationary". As a result, the transition frequency may not be easily ascertainable based on the Doppler broadening of the apparent frequency of the microwave signal. Accordingly, the local oscillator frequency, and thus the frequency reference for the atomic clock, may not be accurate.

To substantially cancel the Doppler broadening of the optimum absorption frequency, the beam interrogation system can also generate at least one optical probe beam having the same wavelength as the pump beam. As an example, a probe beam can be configured as substantially co-linear with and in an opposite direction of the optical pump beam. The intensity of the optical probe beam can be measured to generate an intensity signal. Because the stationary evaporated alkali metal atoms are in resonance with both the optical pump beam and the optical probe beam at the same time, these evaporated alkali metal atoms can have a significantly greater probability of absorption of photons from the optical pump beam relative to the optical probe beam. Therefore, the relative transmitted intensity of the optical probe beam can be significantly greater in response to a frequency of the microwave signal that is in resonance with the hyperfine state transition frequency of the stationary evaporated alkali metal atoms. The intensity signal can thus be combined with the absorption spectrum that is generated for the optical pump beam to provide a signal that is substantially only sensitive to the stationary atoms. As a result, the Doppler broadening of the optimum absorption frequency is substantially cancelled, thus resulting in a substantially accurate optimum absorption frequency.

FIG. 1 illustrates an example of a diagram of an atomic clock system 10 in accordance with an aspect of the invention. As an example, the atomic clock system 10 can be implemented in a satellite application (e.g., global positioning satellite, or GPS) or any of a variety of other applications that require precise timing, small size, and a long operational life. The atomic clock system 10 includes an alkali beam cell 12 having a reservoir chamber 14 and a detection chamber 16. As an example, each of the reservoir and detection chambers 14 and 16 can be configured as glass chambers, such as fabricated from Pyrex®, and can be coupled via an aperture that includes one or more holes that connect the reservoir and detection chambers 14 and 16. Thus, the alkali beam cell 12 can be completely sealed.

The reservoir chamber 14 of the alkali beam cell 12 can initially store a predetermined amount of an alkali metal, such as Cesium (Cs) or Rubidium (Rb). An external heat source 18 can apply heat (e.g., greater than or equal to approximately 80 degrees Celsius) to the alkali beam cell 12, such as along the side-walls of the reservoir chamber 14. As a result, the evaporated atoms of the alkali metal can travel from the reservoir chamber 14 to the detection chamber 16 at a substantially constant rate in a highly predictable manner with a controlled velocity profile into the detection chamber 16. Thus, an alkali metal beam is formed in the detection chamber 16, which can establish an accurate frequency reference for the atomic clock system 10, as described herein.

The atomic clock system 10 also includes a beam interrogation system 20 that includes a pump laser 22 and at least one probe laser 24. Although the pump laser 22 and the at least one probe laser 24 are demonstrated as separate components, it is to be understood that the pump laser 22 and the at least one probe laser 24 can be generated from the same source. The pump laser 22 is configured to generate an optical pump signal $O_{PMP}$ that illuminates the detection chamber 16 to pump the evaporated alkali metal atoms from an initial hyperfine ground state into an excited hyperfine state based on the evaporated alkali metal atoms absorbing photons. The atomic clock system 10 also includes an optical detection system 26 that includes a microwave signal generator 28, a local oscillator 30, and a pump beam photodetector 32. The microwave signal generator 28 can generate a microwave signal MW that is directed to the detection chamber 16 to pump a specific hyperfine ground state transition, such that the evaporated alkali metal atoms can repopulate the initial hyperfine ground state.

The frequency of the microwave signal MW can be controlled by the local oscillator 30. For example, the local oscillator 30 can be tuned to sweep the microwave signal MW through a broad frequency range. Therefore, the pump beam photodetector 32 can monitor an intensity of the optical pump signal $O_{PMP}'$ as it exits the detection chamber, such as generate an absorption frequency spectrum as a function of the frequency of the microwave signal MW. Accordingly, the absorption frequency spectrum can be implemented to determine a transition frequency, such as corresponding to an optimum absorption frequency of the evaporated alkali metal atoms. Therefore, the local oscillator 30 can be locked to the transition frequency to provide a substantially accurate frequency reference for the atomic clock system 10.

Figure 2:
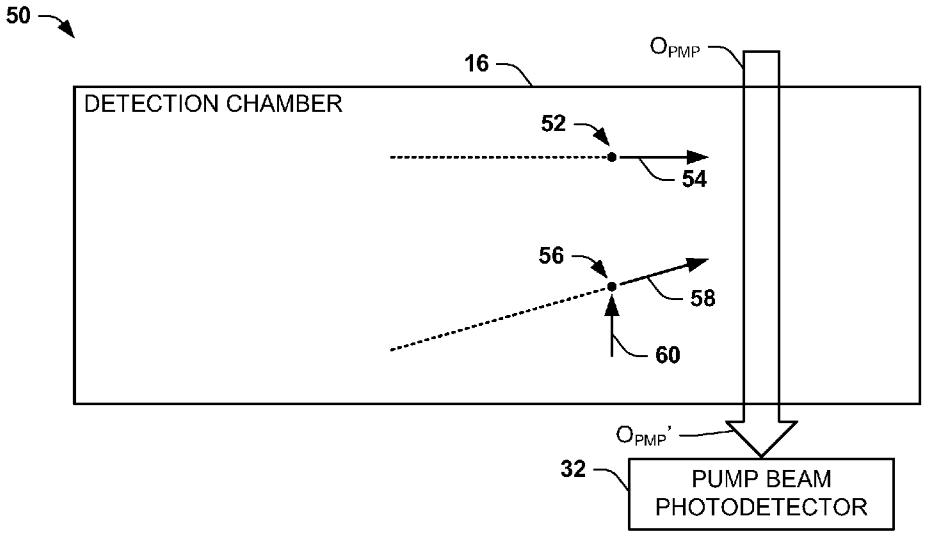
FIG. 2 illustrates an example of a diagram that includes a detection chamber of an alkali beam cell in accordance with an aspect of the invention.

The heat that is generated by the heat source 18 can be very high to evaporate the alkali metal in the reservoir chamber 14. As a result, the evaporated alkali metal atoms can have a very random direction of motion through the detection chamber 16. FIG. 2 illustrates an example of a diagram 50 that includes the detection chamber 16 of the alkali beam cell 12 in accordance with an aspect of the invention. The diagram 50 demonstrates a first evaporated alkali metal atom 52 that is demonstrated as moving in an orthogonal plane relative to the optical pump beam $O_{PMP}$, as demonstrated by an arrow 54. The first evaporated alkali metal atom 52 is therefore stationary with respect to the axis of the optical pump beam $O_{PMP}$, such that it is a stationary evaporated alkali metal atom, as described herein. The diagram 50 also demonstrates a second evaporated alkali metal atom 56 that is demonstrated as moving in a non-orthogonal plane relative to the optical pump beam $O_{PMP}$, as demonstrated by an arrow 58. Specifically, in the example of FIG. 2, the second evaporated alkali metal atom 56 is demonstrated as having a vector component of motion, demonstrated by an arrow 60, that is opposite the direction of the optical pump signal $O_{PMP}$. The second evaporated alkali metal atom 56 is therefore non-stationary with respect to the axis of the optical pump beam $O_{PMP}$, such that it is a non-stationary evaporated alkali metal atom, as described herein. It is to be understood that an evaporated alkali metal atom having a vector component in the same direction of optical pump signal $O_{PMP}$ likewise moves in a non-orthogonal plane relative to the optical pump signal $O_{PMP}$.

The photons that are absorbed from the optical pump beam $O_{PMP}$ or from the microwave field by non-stationary evaporated alkali metal atoms, such as the second evaporated alkali metal atom 56 in the example of FIG. 2, can result in a Doppler broadening of the optimum absorption frequency linewidth. Therefore, the local oscillator 30 may not be able to be accurately locked to the optimum absorption frequency based on the Doppler-broadened frequency response of the evaporated alkali metal atoms 56 to the microwave signal MW. For example, Rubidium atoms may have a resonance line having a natural linewidth of approximately 6 MHz. However, at 80 or more degrees Celsius, the Doppler broadened linewidth could be in a range of approximately 500-800 MHz. As a result, the frequency to which the local oscillator 30 is locked may not be accurately obtainable, thus resulting in an inaccurate frequency reference for the atomic clock system 10.

Referring back to the example of FIG. 1, to substantially cancel the Doppler broadening of the optimum absorption frequency linewidth, the probe laser(s) 24 generate a respective at least one optical probe beam $O_{PRB}$ that likewise illuminate the detection chamber 16. As an example, the probe laser(s) 24 can generate a single optical probe beam $O_{PRB}$ that is substantially co-linear with and in an opposite direction of the optical pump beam $O_{PMP}$. As another example, the probe laser(s) 24 can generate a pair of optical probe beams $O_{PRB}$, one of which being substantially co-linear with and in an opposite direction of the optical pump beam $O_{PMP}$, and the other being substantially parallel with and in the opposite direction of the optical pump beam $O_{PMP}$ and being spaced apart from the optical pump beam $O_{PMP}$ within the detection chamber 16. The optical probe beam(s) $O_{PRB}$ can have an intensity magnitude that is less than or approximately equal to the intensity magnitude of the optical pump beam $O_{PMP}$. For example, the optical probe beam $O_{PRB}$ can have an intensity that is approximately 10% of the intensity of the optical pump beam $O_{PMP}$. The optical probe beam $O_{PRB}$ exits the detection chamber as a beam $O_{PRB}'$ and is provided to a photodetection system 34 that includes a respective one or more photodetectors 36 configured to measure an intensity of the optical probe beams $O_{PRB}'$.

Figure 3:
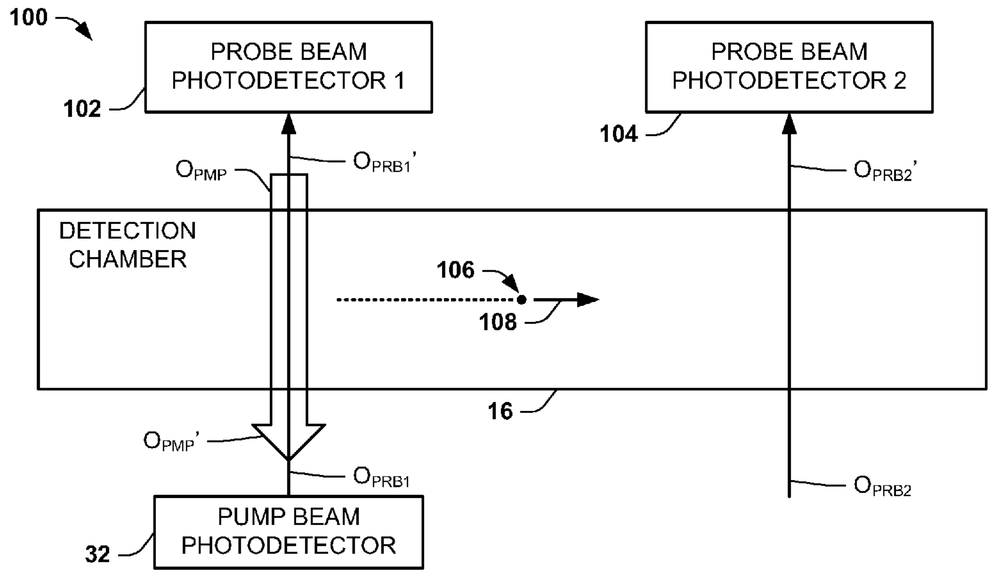
FIG. 3 illustrates another example of a diagram that includes the detection chamber of the alkali beam cell in accordance with an aspect of the invention.

FIG. 3 illustrates another example of a diagram 100 that includes the detection chamber 16 of the alkali beam cell 12 in accordance with an aspect of the invention. The diagram 100 demonstrates the optical pump beam $O_{PMP}$ and a first optical probe beam $O_{PRB1}$ that are substantially co-linear and propagate in opposite directions. The first optical probe beam $O_{PRB1}$ exits the detection chamber 16 as the first optical probe beam $O_{PRB1}$ and is provided to a first probe beam photodetector 102. The diagram 100 also demonstrates a second optical probe beam $O_{PRB2}$ that is substantially parallel with the first optical probe beam $O_{PRB1}$ and which is substantially spaced apart from the first optical probe beam $O_{PRB1}$ and the optical pump beam $O_{PMP}$ within the length of the detection chamber 16. The second optical probe beam $O_{PRB2}$ exits the detection chamber 16 as the second optical probe beam $O_{PRB2}'$ and is provided to a second probe beam photodetector 104. As an example, the first and second probe beam photodetectors 102 and 104 can correspond to the photodetectors 36 in the photodetection system 34 in the example of FIG. 1. The diagram 100 further demonstrates a stationary evaporated alkali metal atom 106 that is demonstrated as moving in an orthogonal plane relative to the optical pump beam $O_{PMP}$ and the first and second optical probe beams $O_{PRB1}$ and $O_{PRB2}$, as demonstrated by an arrow 108.

Referring back to the example of FIG. 1, the photodetection system 34 is configured to generate an intensity signal INT corresponding to the intensity of the one of more of the optical probe signals $O_{PRB}'$ exiting the detection chamber 16. As an example, the intensity signal INT can correspond to an intensity of a single optical probe beam $O_{PRB1}'$, or can correspond to a difference between the intensities of the first and second optical probe beams $O_{PRB1}'$ and $O_{PRB2}'$. In the example of FIG. 1, the intensity signal INT is provided to the optical detection system 26. The optical detection system 26 can be configured to combine the intensity signal INT with the absorption frequency spectrum that is generated for the optical pump signal $O_{PMP}'$ across the tuned frequency of the local oscillator 30. Therefore, the intensity signal INT can provide an indication to the optical detection system 26 of the photon absorption or emission of only the evaporated alkali metal atoms that move in the orthogonal plane relative to the optical pump beam $O_{PMP}$. For example, the intensity signal INT can be combined with a current output signal that is generated by the pump beam photodetector 32 and used to assemble the absorption frequency spectrum. Accordingly, the absorption frequency spectrum can be modified based on the intensity signal INT, such that the intensity signal INT can be substantially only sensitive to stationary atoms, thus cancelling the Doppler broadening of the transition frequency that corresponds to the optimum absorption frequency of the evaporated alkali metal atoms.

Referring again to the example of FIG. 3, as non-stationary evaporated alkali metal atoms pass through the optical pump beam $O_{PMP}$ and the first optical probe beam $O_{PRB1}$, the probability of absorption by the evaporated alkali metal atoms of photons from one of the optical pump beam $O_{PMP}$ and the first optical probe beam $O_{PRB1}$ relative to the other cannot easily be predicted. This is because the evaporated alkali metal atoms that move in the non-orthogonal planes relative to the optical pump beam $O_{PMP}$ can be in resonance with or can have a greater probability of absorption from one of the optical pump beam $O_{PMP}$ and the first optical probe beam $O_{PRB1}$ and not the other based on the vector direction of movement of the atom, the tuning of the microwave frequency, and the wavelength of the light in the beams. Therefore, the first probe beam photodetector 102 and the pump beam photodetector 32 each perceive substantially the same Doppler-broadened intensity response for each of the respective first optical probe beam $O_{PRB1}'$ and optical pump beam $O_{PMP}'$ at frequencies of the microwave signal MW other than the transition frequency, or for wavelengths of the light beams which are not in resonance with the stationary atoms.

However, stationary evaporated alkali metal atoms, such as the atom 106, have a substantially more predictable probability of absorption at the transition frequency at the transition frequency of the microwave signal MW. Specifically, stationary evaporated alkali metal atoms are in substantially equal resonance with both of the optical pump beam $O_{PMP}$ and the first optical probe beam $O_{PRB1}$. Therefore, at the transition frequency of the microwave signal MW corresponding to optimum absorption, the probability of absorption of photons from the first optical probe beam $O_{PRB1}$ relative to the optical pump beam $O_{PMP}$ is significantly reduced. As a result, at the transition frequency of the microwave signal MW, the first probe beam photodetector 102 perceives a substantially greater relative intensity of the first optical probe beam $O_{PRB}'$ than at other frequencies than the transition frequency of the microwave signal MW.

As an example, the first optical probe beam $O_{PRB1}$ and the optical pump beam $O_{PMP}$ can have approximately the same intensity. As described above, the first probe beam photodetector 102 and the pump beam photodetector 32 each perceive substantially the same Doppler-broadened intensity response for each of the respective first optical probe beam $O_{PRB1}'$ and optical pump beam $O_{PMP}'$ at frequencies of the microwave signal MW other than the transition frequency. Therefore, the first probe beam photodetector 102 and the pump beam photodetector 32 perceive approximately the same intensity across the frequency spectrum of the microwave signal MW other than the transition frequency. However, at the transition frequency of the microwave signal MW, a stationary evaporated alkali metal atom has an approximately equal probability (e.g., approximately 50%) of absorbing photons from each of the first optical probe beam $O_{PRB1}'$ and the optical pump beam $O_{PMP}$. Therefore, the measured intensity of the first optical probe beam $O_{PRB1}'$ leaving the detection chamber 16, which is substantially dependent on the interaction with the stationary atoms, is significantly changed at the transition frequency of the microwave signal MW than at other frequencies. Accordingly, the measurable change in intensity of the first optical probe beam $O_{PRB1}'$, as described by the intensity signal INT in the example of FIG. 1, can be indicative of the transition frequency of the microwave signal MW (i.e., having a very narrow linewidth) corresponding to the optimum absorption frequency of the evaporated alkali metal atoms, such that the Doppler-broadening of the optimum absorption frequency can be substantially cancelled.

The above example demonstrates cancellation of the Doppler broadening of the optimum absorption frequency based on only one optical probe beam (i.e., the first optical probe beam $O_{PRB}$). As another example, the optical detection system 26 can substantially cancel the Doppler broadening of the optimum absorption frequency based on both the first and second optical probe beams $O_{PRB1}$ and $O_{PRB2}$. Specifically, the second probe beam photodetector 104 can measure approximately the same Doppler broadened intensity response of the second optical probe beam $O_{PRB2}$ as the optical pump beam $O_{PRB1}'$ across the entire frequency range of the microwave signal MW, including at the transition frequency of the microwave signal MW. However, the first optical probe beam $O_{PRB1}'$ can respond as described above, such that the measured intensity of the first optical probe beam $O_{PRB1}'$ can be significantly changed at the transition frequency of the microwave signal MW relative to other frequencies. Therefore, a measured difference between the intensities of the first and second optical probe beams $O_{PRB1}'$ and $O_{PRB2}'$ can be indicative of the transition frequency of the microwave signal MW for just the stationary atoms, without the Doppler broadening from the non-stationary alkali atoms. The intensity signal INT in the example of FIG. 1 can thus be provided as a signal describing the difference between the intensities of the first and second optical probe beams $O_{PRB1}'$ and $O_{PRB2}'$.

It is to be understood that the intensities of the first and second optical probe beams $O_{PRB1}$ and $O_{PRB2}$ can be set to a variety of intensities. As an example, in the case of implementing a single optical probe beam, the first optical probe beam $O_{PRB1}$ can have an intensity that is less than or equal to the optical pump beam $O_{PMP}$ and the transition frequency of the microwave signal MW is determined base on changes in the measured intensity of the first optical probe beam $O_{PRB1}'$ across the absorption spectrum. As another example, in the case of implementing a pair of optical probe beams, the first and second optical probe beams $O_{PRB1}$ and $O_{PRB2}$ can have a substantially equal intensity and the transition frequency of the microwave signal MW is determined based on a difference between the measured intensities of the first and second optical probe beams $O_{PRB1}'$ and $O_{PRB2}'$ across the absorption spectrum. For example, the first and second optical probe beams $O_{PRB1}$ and $O_{PRB2}$ can each have an intensity that is approximately 10% of the intensity of the optical pump beam $O_{PMP}$.

Referring back to the example of FIG. 1, the intensity signal INT can be provided to the optical detection system 26 to mix the measured intensity of the first optical probe beam $O_{PRB1}'$ or of the first and second optical probe beams $O_{PRB1}'$ and $O_{PRB2}'$ with the measured intensity of the optical pump beam $O_{PMP}$ across the absorption spectrum. As an example, the absorption spectrum can demonstrate the absorption of the first optical probe beam $O_{PRB}'$ as a function of the frequency of the microwave signal MW. Therefore, one or more peaks can be generated in the absorption spectrum across the range of frequencies of the microwave signal MW. Each of the one or more peaks can thus correspond to a narrow linewidth transition frequency of the evaporated alkali metal atoms resulting from the measurement of absorption of the stationary evaporated alkali metal atoms.

Figure 4:
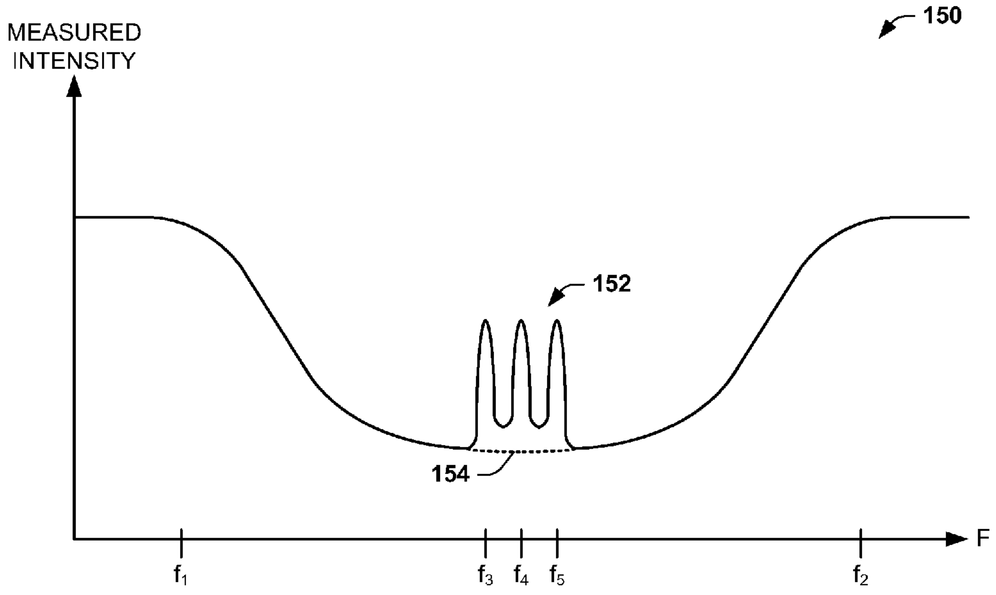
FIG. 4 illustrates an example of an absorption spectrum in accordance with an aspect of the invention.

FIG. 4 illustrates an example of an absorption spectrum 150 in accordance with an aspect of the invention. The absorption spectrum 150 demonstrates a combination of the measured intensity of pump beam photodetector 32 and the intensity signal INT, indicated in the example of FIG. 4 as "MEASURED INTENSITY". As an example, the intensity signal INT can be the measured intensity of the first optical probe beam $O_{PRB1}'$ or can be a difference between the second optical probe beam $O_{PRB2}'$ and the first optical probe beam $O_{PRB1}'$. Therefore, the MEASURED INTENSITY can be a current signal of a photodiode that includes a current output component of the pump beam photodetector 32 and the intensity signal INT. The absorption spectrum 150 plots the MEASURED INTENSITY as a function of frequency F of the microwave signal MW.

The absorption spectrum 150 includes a frequency $f_1$ and a frequency $f_2$ between which the MEASURED INTENSITY is demonstrated as a dip. Therefore, the frequency range between the frequencies $f_1$ and $f_2$ represents the Doppler broadened optimum absorption frequency, as measured, for example, by the pump beam photodetector 32. In addition, the absorption spectrum 150 includes a plurality of peaks 152. Specifically, the peaks 152 include a first peak at a frequency $f_3$, a second peak at a frequency $f_4$, and a third peak at a frequency $f_5$. Each of the peaks 152 can correspond to separate respective narrow linewidth transition frequencies of the evaporated alkali metal atoms, such as resulting from the combination of the intensity signal INT with the intensity of the optical pump signal $O_{PMP}$' as measured by the pump beam photodetector 32. Specifically, the peaks 152 are superimposed over the Doppler broadened optimum absorption frequency perceived by the pump beam photodetector 32, as indicated by the dashed line 154. As a result, the local oscillator 30 can be tuned to one of the frequencies $f_3$, $f_4$, or $f_5$ to obtain an accurate frequency reference for the atomic clock system 10, such as to improve accuracy of the atomic clock system 10 by one hundred times or more that of conventional atomic clocks.

It is to be understood that the absorption spectrum 150 is demonstrated simplistically, and is thus not necessarily in scale. For example, the peaks 152 can be greater than one hundred times narrower than the Doppler broadened optimum absorption frequency between the frequencies $f_1$ and $f_2$. As another example, the absorption spectrum 150 can also include one or more crossover peaks (not shown). As an example, the crossover peaks can be peaks that are positioned between a pair of the peaks 152 that result from non-stationary evaporated alkali metal atoms that are in substantially exact resonance with one of the optical pump beam $O_{PMP}$ and the first optical probe beam $O_{PRB1}$ and not in resonance with the other of the optical pump beam $O_{PMP}$ and the first optical probe beam $O_{PRB1}$. Specifically, the crossover peaks can correspond to non-stationary evaporated alkali metal atoms that are Doppler-shifted up or Doppler-shifted down relative to one of the optical pump beam $O_{PMP}$ and the first optical probe beam $O_{PRB1}$ to be in resonance with one of the neighboring peaks 152. Crossover peaks can, however, be easily identified and disregarded for purposes of locking the frequency of the local oscillator 30 to the one or more transition frequencies represented by the peaks 152.

Figure 5:
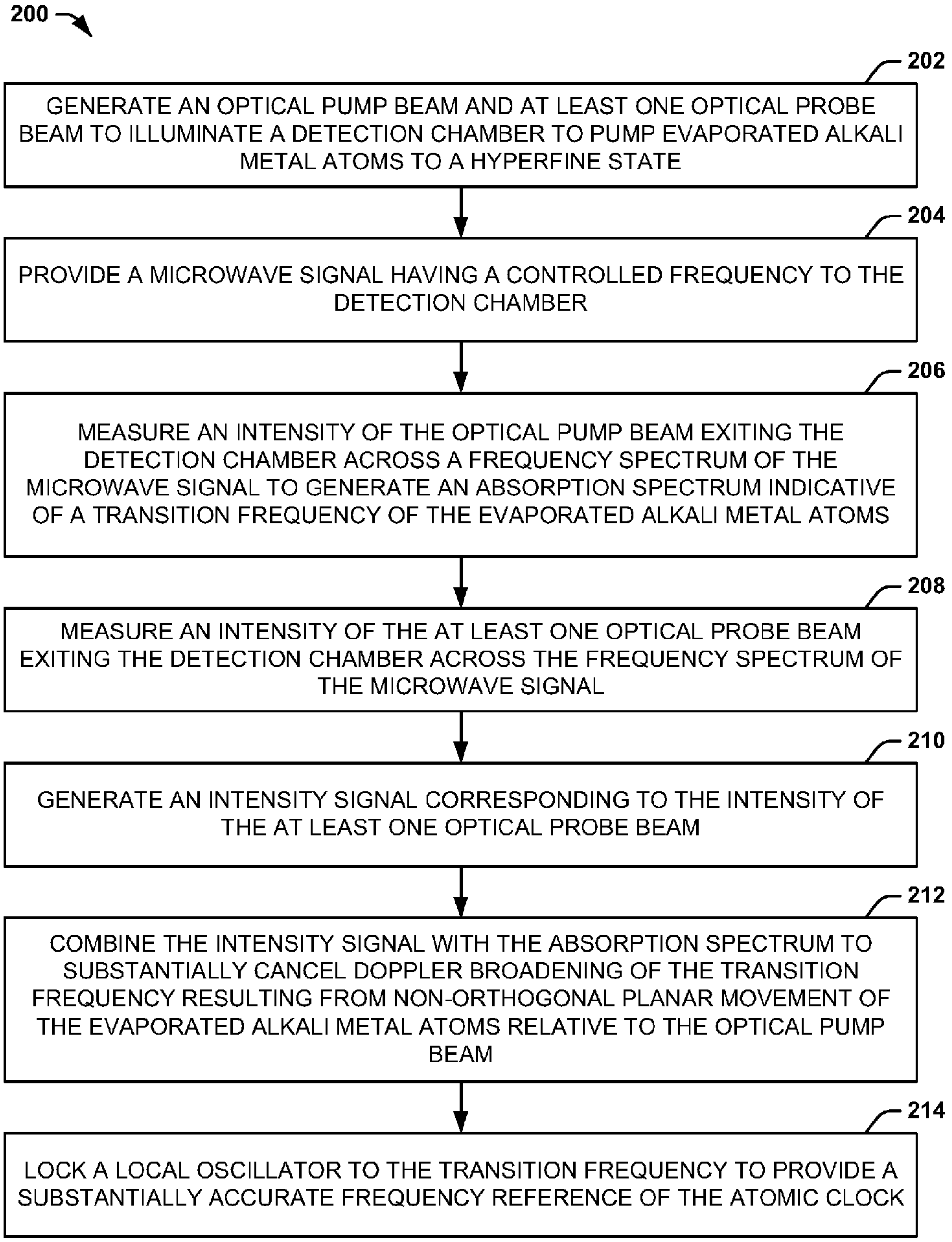
FIG. 5 illustrates an example of a method for tuning a frequency reference of an atomic clock in accordance with an aspect of the invention.

In view of the foregoing structural and functional features described above, a methodology in accordance with various aspects of the present invention will be better appreciated with reference to FIG. 5. While, for purposes of simplicity of explanation, the methodologies of FIG. 5 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for tuning a frequency reference of an atomic clock in accordance with an aspect of the invention. At 202, an optical pump beam and at least one optical probe beam are generated that are configured to illuminate the detection chamber to pump evaporated alkali metal atoms into a hyperfine state as they are collected in a detection chamber of an alkali beam cell. The evaporated alkali metal atoms can be Cs or Rb. The at least one optical probe beam can be a single optical probe beam that is substantially co-linear with and in an opposite direction of the optical pump signal, or could include a second optical probe signal that is substantially parallel with the optical pump beam and spaced apart from the optical pump beam within the volume of the detection chamber.

At 204, a microwave signal having a controlled frequency is provided to the detection chamber. The frequency of the microwave signal can be controlled by a local oscillator, and can be swept across a broad frequency range to obtain an absorption spectrum. The microwave signal can be configured to stimulate emission of photons absorbed by the evaporated alkali metal atoms as a result of the optical pumping. At 206, an intensity of the optical pump beam exiting the detection chamber is measured across a frequency spectrum of the microwave signal to generate an absorption spectrum indicative of a transition frequency of the microwave signal corresponding to optimum photon absorption of the evaporated alkali metal atoms. The optimum photo absorption spectrum can be Doppler-broadened based on the emission of photons of non-stationary evaporated alkali metal atoms that move in a non-orthogonal plane relative to the optical pump beam.

At 208, an intensity of the at least one optical probe beam exiting the detection chamber is measured across the frequency spectrum of the microwave signal. The measurement of the at least one optical probe beam can result from the output signal of an associated photodetector. At 210, an intensity signal corresponding to the intensity of the at least one optical probe beam is generated. The intensity signal can correspond to the intensity of a single optical probe beam or can represent a difference in intensity of a pair of optical probe beams.

At 212, the intensity signal is combined with the absorption spectrum to substantially cancel Doppler broadening of the transition frequency resulting from non-orthogonal planar movement of the evaporated alkali metal atoms relative to the optical pump beam and the at least one optical probe beam. The intensity signal can indicate when the substantially co-linear optical probe beam has a substantially higher intensity in the frequency range of the microwave signal, thus corresponding to the transition frequency of the stationary evaporated alkali metal atoms. At 214, a local oscillator is locked to the transition frequency to provide a substantially accurate frequency reference of the atomic clock.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An atomic clock system comprising:

an alkali beam cell comprising a reservoir chamber configured to evaporate an alkali metal and a detection chamber configured to collect evaporated alkali metal atoms;

a beam interrogation system configured to generate an optical pump beam and at least one optical probe beam that illuminate the detection chamber to pump the evaporated alkali metal atoms as they are collected in the detection chamber;

an optical detection system configured to provide a microwave signal having a controlled frequency to the detection chamber and to measure an intensity of the optical pump beam exiting the detection chamber to determine a transition frequency of the microwave signal corresponding to optimum photon absorption of the evaporated alkali metal atoms; and a photodetection system configured to measure an intensity of the at least one optical probe beam exiting the detection chamber and to generate an intensity signal, the intensity signal being provided to the optical detection system to substantially cancel Doppler broadening of the transition frequency resulting from non-orthogonal planar movement of the evaporated alkali metal atoms relative to the optical pump beam and the at least one optical probe beam.

2. The system of claim 1, wherein the at least one optical probe beam is configured as a first optical probe beam and a second optical probe beam.

3. The system of claim 2, wherein the photodetection system comprises a first photodetector configured to measure a first intensity corresponding to the first optical probe beam and a second photodetector configured to measure a second intensity corresponding to the second optical probe beam, the intensity signal being generated as a difference between the first intensity and the second intensity.

4. The system of claim 2, wherein the first optical probe beam is provided substantially co-linear with and in an opposite direction of the optical pump beam, and wherein the second optical probe beam is provided substantially parallel with the optical pump beam and spaced apart from the optical pump beam within the volume of the detection chamber.

5. The system of claim 1, wherein the at least one optical probe beam is generated at substantially less intensity than the optical pump beam.

6. The system of claim 1, wherein the optical detection system comprises:

a microwave signal generator configured to generate the microwave signal;

a local oscillator configured to control the frequency of the microwave signal to sweep across a broad frequency range; and a pump beam photodetector configured to generate an absorption spectrum in response to the swept frequency of the microwave signal generator.

7. The system of claim 6, wherein the intensity signal is provided to the pump beam photodetector to generate at least one peak on the absorption spectrum corresponding to the transition frequency of the microwave signal for the evaporated alkali metal atoms having orthogonal planar movement relative to the optical pump beam.

8. The system of claim 7, wherein the optical detection system is further configured to lock the local oscillator to the transition frequency to provide a substantially accurate frequency reference for the atomic clock system.

9. The system of claim 1, wherein the at least one probe beam comprises a single optical probe beam that is provided substantially co-linear with and in an opposite direction of the optical pump beam.

10. The system of claim 9, wherein the single optical probe beam has an intensity that is less than or approximately equal to the intensity of the optical pump beam.

11. A method for tuning a frequency reference of an atomic clock, the method comprising:

generating an optical pump beam and at least one optical probe beam that are configured to illuminate the detection chamber to pump evaporated alkali metal atoms into a hyperfine state as they are collected in a detection chamber of an alkali beam cell;

providing a microwave signal having a controlled frequency to the detection chamber;

measuring an intensity of the optical pump beam exiting the detection chamber across a frequency spectrum of the microwave signal to generate an absorption spectrum indicative of a transition frequency of the microwave signal corresponding to optimum photon absorption of the evaporated alkali metal atoms;

measuring an intensity of the at least one optical probe beam exiting the detection chamber across the frequency spectrum of the microwave signal;

generating an intensity signal corresponding to the intensity of the at least one optical probe beam;

combining the intensity signal with the absorption spectrum to substantially cancel Doppler broadening of the transition frequency resulting from non-orthogonal planar movement of the evaporated alkali metal atoms relative to the optical pump beam and the at least one optical probe beam; and locking a local oscillator to the transition frequency to provide a substantially accurate frequency reference of the atomic clock.

12. The method of claim 11, wherein generating the at least one optical probe beam comprises:

generating a first optical probe beam that is substantially co-linear with and in an opposite direction of the optical pump beam; and generating a second optical probe beam that is substantially parallel with the optical pump beam and spaced apart from the optical pump beam within the volume of the detection chamber.

13. The method of claim 12, wherein measuring the intensity of the at least one optical probe beam comprises measuring a first intensity corresponding to the first optical probe beam and measuring a second intensity corresponding to the second optical probe beam, and wherein generating the intensity signal comprises generating the intensity signal as a difference between the first intensity and the second intensity.

14. The method of claim 11, wherein generating the at least one optical probe beam comprises generating the at least one optical probe beam at an intensity that is substantially less than an intensity of the optical pump beam.

15. The method of claim 11, wherein generating the at least one optical probe beam comprises generating a single optical probe beam that is substantially co-linear with and in an opposite direction of the optical pump beam.

16. The method of claim 15, wherein combining the intensity signal with the absorption spectrum comprises generating at least one peak on the absorption spectrum corresponding to the transition frequency of the microwave signal for the evaporated alkali metal atoms having orthogonal planar movement relative to the optical pump beam.

17. The method of claim 15, wherein generating the single optical probe beam comprises generating the single optical probe beam at an intensity that is less than or approximately equal to the intensity of the optical pump beam.

18. An atomic clock system comprising:

means for generating an optical pump beam that illuminates a detection chamber to pump evaporated alkali metal atoms into a hyperfine state as they are collected in a detection chamber of an alkali beam cell;

means for generating an optical probe beam that is substantially co-linear with and in an opposite direction of the optical pump beam;

means for providing a microwave signal having a controlled frequency to the detection chamber;

means for measuring an intensity of the optical pump beam exiting the detection chamber across a frequency spectrum of the microwave signal to generate an absorption spectrum indicative of a transition frequency of the microwave signal corresponding to optimum photon absorption of the evaporated alkali metal atoms; and means for measuring an intensity of the optical probe beam exiting the detection chamber across the frequency spectrum of the microwave signal and for generating an intensity signal corresponding to the intensity of the at least one optical probe beam, the intensity signal being provided to the means for measuring the intensity of the optical pump beam to substantially cancel Doppler broadening of the transition frequency resulting from non-orthogonal planar movement of the evaporated alkali metal atoms relative to the optical pump beam and the optical probe beam.

19. The system of claim 18, further comprising:

means for generating a second optical probe beam spaced apart from the optical pump beam within the volume of the detection chamber; and means for measuring an intensity of the second optical probe beam exiting the detection chamber across the frequency spectrum of the microwave signal;

wherein the intensity signal is indicative of a difference between the intensity of the first optical probe beam and the intensity of the second optical probe beam.

20. The system of claim 18, further comprising means for locking a local oscillator to the transition frequency to provide a substantially accurate frequency reference of the atomic clock system.

* * * * *